United States Patent
Lanford et al.

[19]

[11] Patent Number: 6,057,223
[45] Date of Patent: *May 2, 2000

[54] PASSIVATED COPPER CONDUCTIVE LAYERS FOR MICROELECTRONIC APPLICATIONS

[75] Inventors: William A. Lanford, Malden Bridge; Wei Wang, Albany, both of N.Y.; Peijun Ding, San Jose, Calif.

[73] Assignee: The Research Foundation of State University of New York, Albany, N.Y.

[*] Notice: This patent is subject to a terminal disclaimer.

[21] Appl. No.: 09/021,666

[22] Filed: Feb. 10, 1998

Related U.S. Application Data

[62] Division of application No. 08/478,491, Jun. 7, 1995, Pat. No. 5,766,379.

[51] Int. Cl.[7] ................................................ H01L 21/4763
[52] U.S. Cl. ...................... 438/618; 438/620; 438/768; 427/123; 427/376.6; 427/383.1; 204/192.15; 204/192.17; 257/700; 257/701; 257/706; 257/712; 257/713; 257/717
[58] Field of Search ..................... 257/700, 701, 257/706, 712, 713, 717, 720; 438/618, 620, 768; 427/123, 376.6, 383.1; 204/192.15, 192.17

[56] References Cited

U.S. PATENT DOCUMENTS

| | | | |
|---|---|---|---|
| 3,663,279 | 5/1972 | Lepselter | 117/212 |
| 3,702,427 | 11/1972 | Learn et al. | 317/234 R |
| 4,108,736 | 8/1978 | Rigo et al. | 204/1.5 |
| 5,230,965 | 7/1993 | Cole, Jr. et al. | 428/601 |
| 5,622,608 | 4/1997 | Lanford et al. | 204/192.15 |

OTHER PUBLICATIONS

Li et al.; Copper Deposition and Thermal Stability Issues in Copper–Based Metallization for ULSI Technology; *Materials Science Reports*, 9:1–51, (Aug. 20, 1992).

Ding et al.; Effects of the Addition of Small Amounts of Al to Copper: Corrosion, Resistivity, Adhesion, Morphology, and Diffusion; *J. Appl. Phys.*, 75(7):3627–3631 (Apr. 1, 1994).

Itow et al; Self–Aligned Passivation on Copper Interconnection Durability Against Oxidizing Ambient Annealing; *Applied Physics Letters*, 63(7):934–936 (Aug. 16, 1993).

Li et al.; Oxidation and Protection in Copper and Copper Alloy Thin Films; *J. Appl. Phys.*, 70(5):2820–2827 (Sep. 1, 1991).

Li et al.; Refractory Metal Nitride Encapsulation for Copper Wiring; *MRS Bulletin*, 52–56 (Jun. 1993).

Ding et al; Oxidation Resistant High Conductivity Copper Films; *Appl. Phys. Lett.*, 64(21):2897–2899 (May 23, 1994).

Ding et al.; Thermal Annealing of Buried Al Barrier Layers to Passivate the Surface of Copper Films; *Appl. Phys. Lett*, 65(14):1778–1780 (Oct. 3, 1994).

Clyne et al.; Proceedings of the 2$^{nd}$ European Conference on Advanced Materials and Processes; *University of Cambridge UK*, vol. 1 Advanced Processed:362–364 (Jul. 22–24, 1991).

(List continued on next page.)

*Primary Examiner*—Charles Bowers
*Assistant Examiner*—Reneé R. Berry
*Attorney, Agent, or Firm*—Myers Bigel Sibley & Sajovec, P.A.

[57] ABSTRACT

A copper conductor is formed which is included as a component in microelectronic devices. The conductor is formed by forming a metal layer on the surface of a microelectronic substrate, forming a copper layer on the metal layer, and annealing the metal and copper layers. The annealing step diffuses at least some of the metal layer through the copper layer to the surface thereof where the diffused metal forms a protective metal oxide at the surface of the copper layer. As a result, the metal oxide layer passivates the copper layer.

20 Claims, 3 Drawing Sheets

OTHER PUBLICATIONS

Newberg et al.; Thermal Conductivity and Microstructure Stability of Heat Treated Amzirc Copper–Based Alloys; *Microstructural Science*, 16:231–243.

Shumay, Jr.; Copper's Expanding Role in Microelectronics; *Advanced Materials & Processes Inc. Metal Process*, 54–60 (Dec. 1987).

Arcot et al.; Intermetallic Reactions Between Copper and Magnesium As an Adhesion/Barrier Layer; Mat. Res. Soc. Symp. Proc. 225:231–236 (1991).

Ding et al.; Ion Implantation To Inhibit Corrosion of Copper; Mat. Res. Soc. Symp. Proc., 265:199–204 (1992).

Ding et al.; Observation of Reduced Oxidation Rates for Plasma–Assisted CVD Copper Films; Mat. Res. Soc. Symp. Proc., 309:455–460 (1993).

Ding et al.; Annealing of Boron–Implanted Corrosion Resistant Copper Films; *J. Appl. Phys.*, 74(2):1331–1334 (Jul. 15, 1993).

PASSIVATED COPPER CONDUCTIVE LAYERS FOR MICROELECTRONIC APPLICATIONS

RELATED APPLICATIONS

This application is a divisional of U.S. application Ser. No. 08/478,491, filed on Jun. 7, 1995, now U.S. Pat. No. 5,766,379, which is hereby incorporated by reference in its entirety.

FIELD OF THE INVENTION

The present invention relates to microelectronic device manufacture, and more particularly to manufacturing passivated conductive layers for microelectronic applications.

BACKGROUND OF THE INVENTION

Multilevel metallization of large scale microelectronic devices has become an area of significant interest as devices are scaled down to increase circuit density. As device size is scaled down, metallization reliability is becoming increasingly significant, requiring good conductivity, electromigration resistance, and adherence to dielectric substrates. Copper has attracted significant attention due to its lower electrical resistivity and superior electromigration lifetime in comparison to widely-used aluminum based metals.

Nonetheless, technical problems exist regarding the use of copper in microelectronic devices. For example, the interface between copper (Cu) and an insulating or dielectric material, such as silicon dioxide ($SiO_2$), can suffer from poor adhesion. Another Cu-dielectric interface problem is the undesirable transport of copper ions into the dielectric material. The copper ions can potentially disrupt the properties of the dielectric. Moreover, if transported through the dielectric to the electrically active Si, copper can cause additional problems.

The second interface, the exposed copper surface, is susceptible to oxidation during processing, forming copper-containing oxides. This can be particularly troublesome, since copper, unlike aluminum, on continued exposure will continue to react with oxygen, thus adversely impacting the resistivity of the copper layer and potentially causing other problems. As a result, adequate protection (passivation) of these interfaces must be achieved to obtain high quality, reliable devices.

To form a diffusion barrier/adhesion promoter layer, traditional methods have focused on placing a suitable material between the copper and the dielectric. Several materials have been employed, including refractory metals and carbon. However, these materials can suffer from various limitations and disadvantages. Thus, to the best of the inventors' knowledge, no one material has been widely accepted by the industry.

Regarding surface passivation, doping the copper with a metal which can be used to passivate the exposed copper surface has been attempted. More particularly, this method involves utilizing physical vapor deposition (PVD) to codeposit the metals as a film onto the surface of a dielectric substrate. Subsequently, the co-deposited film is annealed and exposed to an oxidizing ambient to form a passivating surface layer. As reported by Ding et al., *J. Appl. Phys. Lett.* 75 (7), 3627 (1994), and Ding et al., *J. Appl. Phys. Lett.* 64, 2897 (1994), aluminum and magnesium have been employed due to their ability to form extremely oxidation resistant surfaces.

Current trends in microelectronic device processing use metallization layers with higher aspect ratios, i.e., deeper trenches and vias, to increase circuit performance. PVD, however, has been shown to be largely ineffective in depositing metal onto surfaces with such dimensions.

One deposition technique which has been found to be useful is chemical vapor deposition (CVD). As opposed to PVD, CVD deposits metal onto a substrate with the aid of a gas-phase chemical reaction, thus allowing the trenches and vias to readily receive the material. Nonetheless, utilizing CVD for co-deposition of metals poses severe technical challenges. Accordingly, surface passivation by CVD co-deposition cannot be readily achieved.

Other recent passivation attempts have focused on simultaneously accomplishing surface passivation and diffusion barrier/adhesion promotion through the use of refractory metals and refractory metal alloys as reported by Lin et al., *MRS Bulletin XVIII*, 52 (1993). In this process, metals like titanium, chromium, molybdenum, and vanadium are deposited onto silicon dioxide substrates, with copper being subsequently deposited on top of this metal layer. The structure is annealed and exposed to an ammonia ambient such that the diffused refractory metal forms a nitride layer which passivates the copper. The remaining metal serves as a diffusion barrier/adhesion promoter.

Although formation of barrier layers can be achieved, employing refractory metals is highly disadvantageous. For example, extremely high annealing temperatures (i.e., 500–650° C.) are generally required for successful diffusion and nitride layer formation. High manufacturing temperatures are undesirable, however, because of the adverse impact such temperatures can have on the integrity of the device. Indeed, the trend is towards decreasing processing temperatures. This is especially true for efforts employing polymeric material as a dielectric. Additionally, process conditions must be closely controlled to minimize excessive dissolution of refractory metal into the copper which causes a significant increase in copper resistivity. Moreover, because some of these materials have not been widely employed in microelectronic device processing, a substantial investment in new manufacturing equipment would likely be required if such processes were to be implemented on a large scale in the future.

SUMMARY OF THE INVENTION

The present invention provides microelectronic devices which include a passivated copper conductor as a component thereof. The conductor includes a metal, preferably aluminum or magnesium, layer on a substrate, a copper layer on top of this metal layer, and a protective inert metal oxide layer on top of the copper layer. The inert metal oxide layer is formed from the same metal deposited on the substrate surface.

The copper conductor exhibits both diffusion barrier and adhesion promoter properties. Further, the exposed surface of the copper conductor is passivated so as to prevent the formation of copper oxides on the surface thereof. The microelectronic device exhibits good electrical properties and thus is suitable for high performance applications.

The present invention provides low temperature methods for manufacturing passivated conductive layers in a microelectronic device. Metals can be used, such as aluminum metal, which are currently widely used in microelectronic processing, thus making possible employment of existing equipment. Further, because the method can be conducted at relatively low processing temperatures, damage to the device and its components can be minimized or eliminated. Further, chemical deposition techniques (CVD) can be used to form this conductor, thus improving step coverage.

In the process of the present invention, a microelectronic device having a copper conductor is formed by first forming a metal layer on a dielectric substrate. The dielectric substrate can be, for example, a silicon wafer which has been oxidized to form a surface layer of silicon dioxide ($SiO_2$). The metal of the metal layer is selected to provide adhesion and diffusion barrier properties. Further, a metal is selected which is capable of diffusing through a copper layer to the surface thereof at low processing temperatures.

Next, a copper layer is formed on the metal layer. The resulting metal layer and copper layer are etched or patterned using conventional techniques. The device is annealed to diffuse some of the metal layer through the copper layer to the exposed surfaces thereof. Here the metal on exposure to a low pressure of oxygen forms a passivating metal oxide layer on the exposed surfaces of the copper layer.

Preferably, the metal layer comprises magnesium or aluminum as these materials can form a barrier to copper migration and can sufficiently adhere the copper layer to the silicon dioxide substrate. Moreover, at low temperatures, these metals diffuse through the copper layer without severely impacting the resistivity of copper and can form a surface oxide passivating the copper.

The annealing step of the invention includes heating the metal and copper layers of the device to a temperature sufficient to dissolve some of the metal into the copper layer and to diffuse the dissolved metal to the surface thereof. The device is annealed for a sufficient period of time to allow adequate diffusion of the metal through the copper layer. Preferably, the diffusing step is conducted at a temperature of 200° C. to 400° C. for 30 to 60 minutes.

An oxidizing ambient is then introduced to oxidize metal at the surface of the copper to form a metal oxide having a thickness sufficient to passivate the copper. Advantageously, oxygen is provided at low (i.e., $10^{-6}$ to $10^{-1}$ Torr) pressures to oxidize the diffused metal to form a metal oxide layer without appreciable reaction between copper and oxygen. Metal diffuses and reacts with oxygen for the duration of this step until the oxide layer is continuous and of such thickness (e.g., 3 to 7 nanometers) that oxygen can no longer react with metal, thus passivating the copper. Preferably, when introducing the oxidizing ambient, the temperature of the copper layer and the metal layer is maintained at a temperature of 200° C. to 400° C. for one to 60 minutes.

The diffusing step and oxidizing step can occur simultaneously. That is, the device can be heated to the desired temperature such that diffusion occurs while simultaneously introducing an oxidizing ambient. Preferably, however, the diffusing step and the oxidizing step occur serially, i.e., in separate stages, with the diffusing step taking place in an inert ambient prior to introducing the oxidizing ambient.

In accordance with the invention, a microelectronic device comprising a copper layer of low resistivity, preferably less than about 3 micro-ohm·centimeter, more preferably about 2 micro-ohm·centimeter, or lower, is obtained. As a result, the device is well suited for high speed processing in a vast array of applications. Moreover, the device is reliable and stable since the presence of a diffusion barrier/adhesion promoter and passivating layers minimize undesirable complications.

BRIEF DESCRIPTION OF THE DRAWINGS

Some of the features and advantages of the invention having been stated, others will become apparent from the detailed description which follows, and the accompanying drawings in which.

DETAILED DESCRIPTION OF THE INVENTION

The present invention now will be described more fully hereinafter with reference to the accompanying drawings, in which the preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
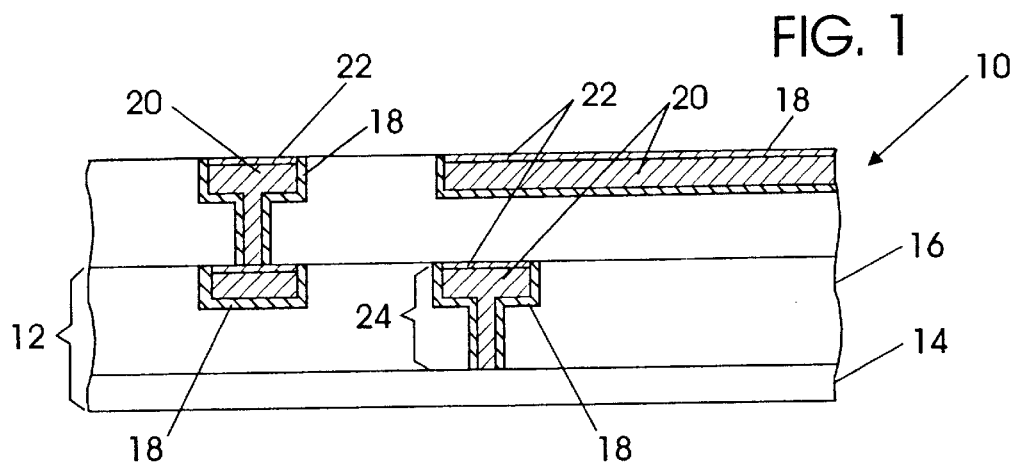
FIG. 1 is a schematic cross-sectional view of a microelectronic device of the present invention.

FIG. 1 is a schematic cross-sectional view of a microelectronic device of the present invention, designated generally as 10. Microelectronic device 10 can be, for example, a wafer for use in VLSI (very large scale integrated) circuits, ULSI (ultra large scale integrated) circuits, and the like. Such wafers are known in the art.

In FIG. 1, a substrate 12 provides support for subsequent layers of the microelectronic device 10. Substrate 12 can be formed of any suitable material known to the skilled artisan, such as silicon wafer 14 having a silicon dioxide insulating layer 16 on the surface thereof. The substrate 12 includes trenches and vias, designated generally as 17, etched therein.

A patterned metal layer 18 is present on the face of substrate 12. The types of metal which can be used to form metal layer 18 in accordance with the present invention are described in more detail below. Microelectronic device 10 also includes a patterned copper layer 20 on metal layer 18, and an inert protective metal oxide layer 22 on the surface of copper layer 20 formed from the same metal in metal layer 18.

Metal layer 18, copper layer 20 and metal oxide layer 22 together comprise a copper conductor layer 24. In accordance with the invention, copper conductor 24 as shown in FIG. 1 possesses low resistivity, preferably less than about 3 micro-ohm·centimeter, more preferably about 2 micro-ohm·centimeter, or less. Accordingly, microelectronic device 10 incorporating conductor layer 24 can be suitable for numerous high speed applications. Additionally, the device 10 can be reliable since the presence of passivating metal oxide layer 22 serves as an effective barrier against potentially damaging oxidation. Moreover, the presence of metal layer 18 is especially desirable as it forms a bond with the substrate interface. As a result, the bonded material not only provides suitable adhesion, but also serves as a layer which impedes migration of copper ions into the substrate.

FIG. 1 further illustrates the manufacture of additional insulating and conductive layers to form a multilayer microelectronic device.

Figure 2:
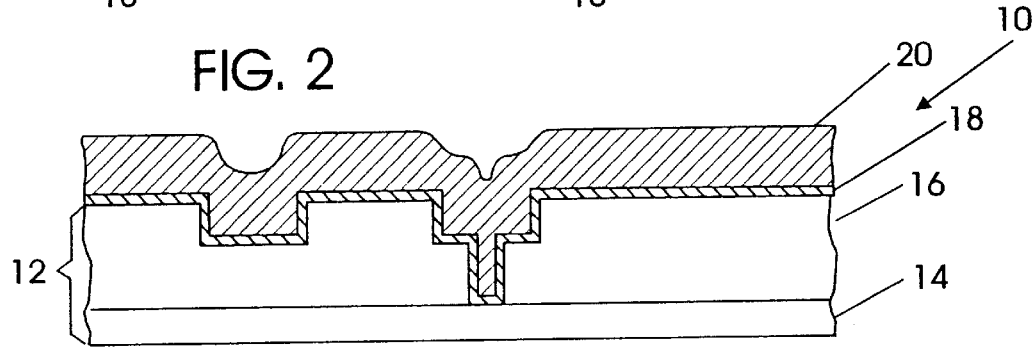
FIGS. 2, 3 and 4 are schematic side cross sectional views of the microelectronic device of FIG. 1 in progressive stages of manufacture, and illustrate a method in accordance with the invention for manufacturing the device.
Figure 3:
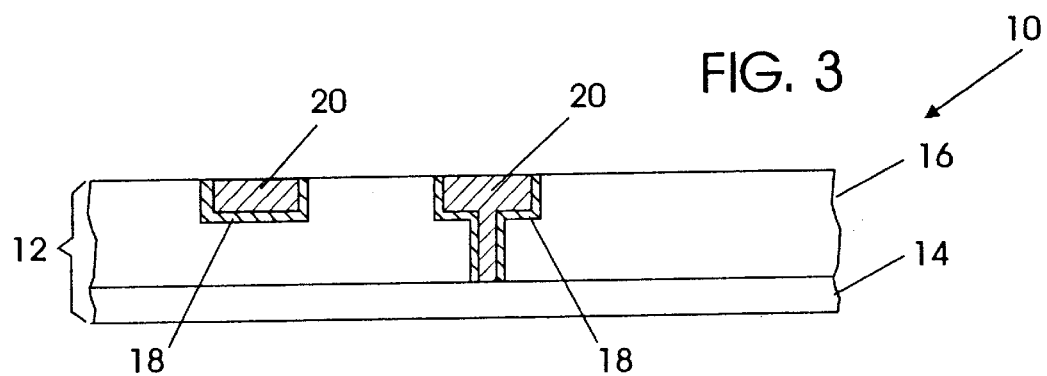
Figure 4:
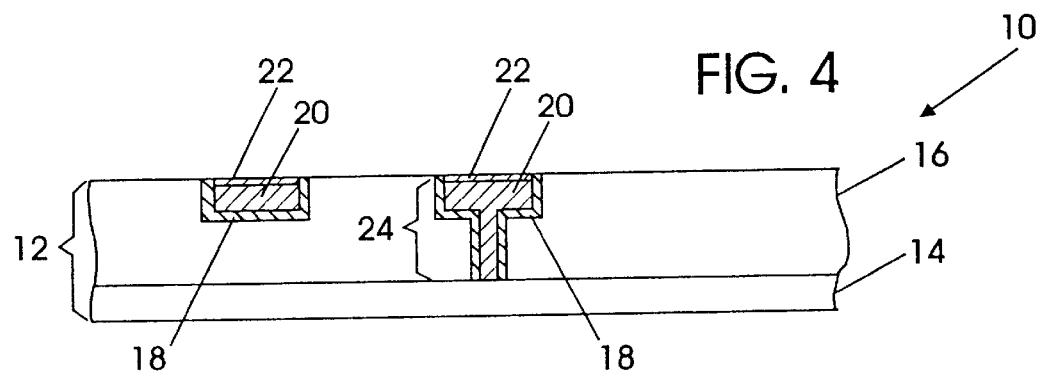

A method for fabricating microelectronic device 10 in accordance with the present invention is illustrated in FIGS. 2, 3, and 4. Specifically, FIGS. 2, 3 and 4 illustrate schematic side cross sectional views of microelectronic device 10 in various stages of manufacture.

FIG. 2 illustrates a substrate 12 with metal layer 18 deposited onto the surface thereof, as well as into the trenches and vias 17. As illustrated, metal layer 18 is patterned using conventional techniques and equipment to form a liner layer. After metal layer 18 is formed, copper layer 20 is then deposited on the surface of metal layer 18.

As illustrated in FIG. 3, residual copper bordering the trenches and vias is removed using conventional patterning and planarization techniques to leave metal only in the trenches and vias. The copper layer can be planarized, for example, using chemical mechanical planarization ("CMP") techniques, as are well known to the skilled artisan.

Each of metal layer 18 and copper layer 20 can be formed using conventional equipment and methods. For example, each of metal layer 18 and copper layer 20 can be deposited by physical vapor deposition techniques, such as sputtering, and the like. Alternatively, each of metal layer 18 and copper layer 20 can be deposited using chemical vapor deposition (CVD) techniques. CVD is particularly advantageous in manufacturing metallization layers with higher aspect ratios, i.e., deeper trenches and vias.

Processing conditions for metal layer 18 and copper layer 20 formation are selected according to the desired end product configuration and characteristics and desired manufacturing conditions. Power levels, pressure levels, processing ambient, temperature, time, and other typical process conditions can vary according to the deposition system used, and are known to the skilled artisan.

The thickness of the copper layer 20 is predetermined according to design considerations of microelectronic device 10. As illustrated in the Figures, preferably copper layer 20 is substantially thicker than metal layer 18. Current designs suggest a preferred copper layer thickness from about 200 to 1000 nanometers.

The amount of metal 18 deposited is an amount sufficient to provide for adhesion of the copper layer to the substrate, yet also to provide a passivating oxide layer on the surface of the copper layer, as explained in more detail below. Metal layer thicknesses preferably range from 2 to 20 nanometers.

After metal layer 18 and copper layer 20 are deposited and patterned and/or planarized, microelectronic device 10 is annealed to form a protective inert metal oxide layer 22 on the exposed surfaces of copper layer 20, as illustrated in FIG. 4. More particularly, metal layer 18 and copper layer 20 are annealed so as to diffuse a portion of metal layer 18 through copper layer 20 to the surface thereof. There the metal oxidizes to form a metal oxide on the surface of copper layer 18 which passivates the copper surface. In addition, advantageously, a portion of the metal layer 18 remains at the interface between copper layer 20 and substrate 10 to provide a copper adhesion layer.

Accordingly, the metal of metal layer 18 is selected based upon a variety of desired characteristics. Generally any metal can be employed which can form a passivating oxide barrier layer, and which can diffuse through copper at relatively low temperatures (i.e., below 400° C.). Further, the metal selected should be capable of adhering a copper layer to a substrate, i.e., a silicon dioxide substrate.

Further, the metal should not significantly increase the resistivity of the copper layer. This can mean that, for example, the metal is one capable of diffusing through a copper layer at low concentrations so that after annealing the amount of metal remaining in the copper layer (if any) does not significantly adversely impact (i.e., increase) the resistivity of the copper layer. Alternatively, this can mean that the metal is capable of forming an alloy with the copper (such as $Cu_2Mg$) which also has a low resistivity.

Advantageously, the resistivity of the copper layeris not increased above about 3 micro-ohm·centimeter ($\mu\Omega$·cm), and preferably is about 2 micro-ohm·centimeter, or less. For purposes of comparison, pure copper layers exhibit a bulk resistivity of about 1.67 $\mu\Omega$·cm, and currently used aluminum based layers exhibit a resistivity of about 3.5 $\mu\Omega$·cm.

In addition, it is advantageous to select a metal which has a greater reactivity with oxygen relative to copper so as to suppress the undesirable formation of copper oxide at the upper surface of the copper layer. Further, the metal is one which can serve as a diffusion barrier at a substrate/copper interface. Exemplary metals include aluminum and magnesium.

Referring again to FIG. 4, as noted above, after the metal layer and the copper layer are formed and patterned, the device is annealed. Although not wishing to be bound by any explanation of the invention, it is presently believed that upon annealing, a portion of the metal in metal layer 18 migrates or diffuses through copper layer 20 to the exposed surface of the copper layer. The metal which diffuses through the copper layer forms an inert metal oxide on the exposed surface of the copper layer which passivates the copper layer. In addition, it is also believed that a portion of the metal in metal layer 18 remains at the interface of the substrate 12 and copper layer 20 to promote adhesion of the copper layer to the substrate surface.

When metal layer 18 is a magnesium layer, it is believed that upon annealing a portion of the magnesium can remain in the copper layer and form an electrically conductive alloy with copper. The alloy is believed to have the formula $Cu_2Mg$. The conductivity of the annealed copper layer is not significantly decreased by the presence of magnesium, because magnesium remaining in the copper layer does not remain in solution in the copper but rather forms a conductive alloy therewith. Thus the process of the invention can be economically feasible in commercial applications because precise amounts of magnesium do not have to used in the formation of metal layer 18 to provide a product with desirable characteristics.

When metal layer 18 is an aluminum layer, in contrast to the effect of the magnesium/copper alloy, the conductivity of the copper layer can be noticeably decreased by the presence of the aluminum, depending on the concentration of aluminum which remains in the copper layer 20. Namely, aluminum concentrations greater than about 1 weight percent aluminum in the copper layer are believed to cause too large an increase in resistivity to be useful. Accordingly, aluminum quantities for the process according to the invention should be optimally selected. A sufficient amount of aluminum should be employed to form a suitable adhesion/barrier layer with the substrate 12 and to form a passivating metal oxide layer without an undesirable excess of aluminum remaining in the copper, preferably less than about 1 weight percent, and more preferably less than about 0.3 weight percent. Therefore, unlike magnesium, the feasibility of the process in commercial applications could depend upon the more precise control of the residual amounts of aluminum dissolved in the copper conductor. This control can be achieved by control of the thickness of the metal layer 18 and by careful control of the annealing stage.

Annealing can be conducted using conventional techniques and apparatus as known in the art. In accordance with the invention, annealing conditions are selected so that the metal diffuses through the copper layer 20 and reacts with oxygen before any appreciable amounts of copper at the surface reacts to form copper oxide. Specifically, the device including metal and copper layers 18 and 20 is heated under vacuum such that a portion of the metal layer diffuses through the copper layer to the surface thereof. An oxidizing ambient or atmosphere is then introduced to oxidize the metal at the surface of the copper layer so as to form a copper passivating metal oxide layer 22.

A variety of time, pressure, and temperature conditions can be used to heat the device during the annealing step in accordance with the invention. These conditions are chosen to facilitate metal diffusion through copper layer 20. Advantageously, the device can be heated between 30 and 60 minutes under a vacuum. Temperature is selected so as to ensure that the amount of metal, if any, remaining in the copper layer after annealing does not adversely affect the conductivity of the copper layer 20 as noted above. Depending on the metal, the device is heated to a temperature from 200° C. to 400° C.

As noted above, complete diffusion of magnesium out of the copper layer is not critical because magnesium forms a conductive alloy with copper. It is noted that when the metal layer is a magnesium layer, temperatures greater than about 400° C. can cause Mg and $SiO_2$ to react, releasing free silicon ions from the substrate to migrate into copper layer. This can adversely impact the resistivity of the copper layer.

The annealing process also includes introducing an oxidizing atmosphere to the metal layer 18 and copper layer 20 to form the passivating layer 22. Typically, the same equipment used to heat the device can be also used to introduce an oxidizing ambient; nonetheless, other arrangements known to the skilled artisan may be employed without departure from the scope of the invention.

The annealing process can take place in one step during which heat and low levels of oxygen are simultaneously introduced in the annealing chamber to carry out diffusion and subsequent oxide layer formation. That is, heating the device and introducing the oxidizing ambient can occur simultaneously, i.e., the device can be heated as described above while simultaneously introducing an oxidizing ambient in the process chamber. Alternatively, the annealing step can be carried out serially, i.e., in stages or phases. Preferably, the device is heated and then oxidized in separate stages, with the device initially heated as described above in an inert ambient (i.e., argon, nitrogen, etc.) or vacuum prior to introducing the oxidizing ambient.

In accordance with the invention, the oxidizing step is particularly advantageous as the formation of metal oxide layer 22 is self-limiting, i.e., no external means are necessary to stop the growth of the metal oxide layer 22. More particularly, at the beginning of the oxidation step, diffused metal at the copper surface will react with oxygen so as to begin formation of metal oxide. Oxygen pressure level is important for adequate formation of layer 22. Too much oxygen before sufficient aluminum or magnesium metal is present at the copper surface to react with the oxygen can result in the oxidation of copper rather than the formation of metal oxide. Moreover, an insufficient oxygen level will not be enough to fully form layer 22. An oxygen pressure of $10^{-6}$ to $10^{-1}$ Torr is preferred.

Since most of the metal at the copper surface will react with oxygen, the concentration of unoxidized metal at the copper layer 20 surface will be low. As a result, metal from metal layer 18 will continue to dissolve into and diffuse through the copper layer 20 to undergo oxidation. This sequence repeats itself throughout the oxidizing step.

The reaction of metal and oxygen proceeds until the metal oxide layer 22 is substantially continuous across the copper layer and sufficiently thick (preferably, between 3 and 7 nanometers) so as to effectively block any diffused metal from reacting with oxygen. At this point, the copper layer 20 is effectively passivated. Preferably, the oxidizing step occurs between 1 and 60 minutes; more preferably, the step occurs between 1 and 30 minutes. During this stage, the device can be maintained at the temperatures described above, and preferably at temperatures between 200° C. and 400° C.

In accordance with the invention, the resulting copper conductor layer 24 exhibits low resistivity, preferably less than about 3 micro-ohm·centimeter, and more preferably about 2 micro-ohm·centimeter, or less. Accordingly, the device 10 incorporating conductor layer 24 can be suitable for numerous high speed applications. Additionally, the device 10 is reliable since the presence of passivating metal oxide layer 22 serves as an effective barrier against potentially damaging oxidation. Moreover, the presence of metal layer 18 is especially desirable as it forms a bond with the substrate. As a result, the bonded material not only provides good adhesion, but also serves as a layer which substantially impedes migration of copper ions into the substrate.

Moreover, the process for producing conductor layers is particularly advantageous since it employs lower temperatures than used in previous adhesion barrier/passivation processes. This is particularly significant in view of the growing trend toward the use of lower temperatures in semiconductor device manufacturing and the use of polymers in substrates. Moreover, since the process is directed to metals which have been employed in microelectronic device processing, especially aluminum, additional capital costs required to employ new diffusion barrier and/or passivating processes can be minimized.

The following examples serve to illustrate the invention but are not intended to be limitations thereon.

EXAMPLE 1

Copper/magnesium/silicon dioxide films were deposited by DC-magnetron sputtering with an argon pressure of $3\times10^{-3}$ Torr. Films were made by first depositing 15 nm of magnesium, followed by 500 nm of copper (without breaking vacuum), onto Si wafers with 100 nm of thermally grown $SiO_2$. The base pressure in the sputtering chamber was $2\times10^{-7}$ Torr. The Mg and Cu metal targets were nominally 99.99% pure. The deposition rates were approximately 20 and 150 nanometers/minute for Mg and Cu, respectively.

These as-deposited films were then cut into 2 cm by 2 cm pieces. Some of these as-deposited samples were then vacuum annealed at a pressure of $6\times10^{-6}$ Torr for 30 to 60 minutes at temperatures ranging from 250–400° C.

Typical results for films made in this way are as follows: First, and importantly, the resistivity of these films is good. The as-deposited films had a resistivity of approximately 2.32 $\mu\Omega$·cm which upon annealing to 350° C. for 60 minutes dropped to 2.0 $\mu\Omega$·cm. This value for resistivity is the same, within experimental error, as the resistivity for pure sputtered copper made using the same procedures but without the deposition of the 15 nm of Mg.

Figure 5:
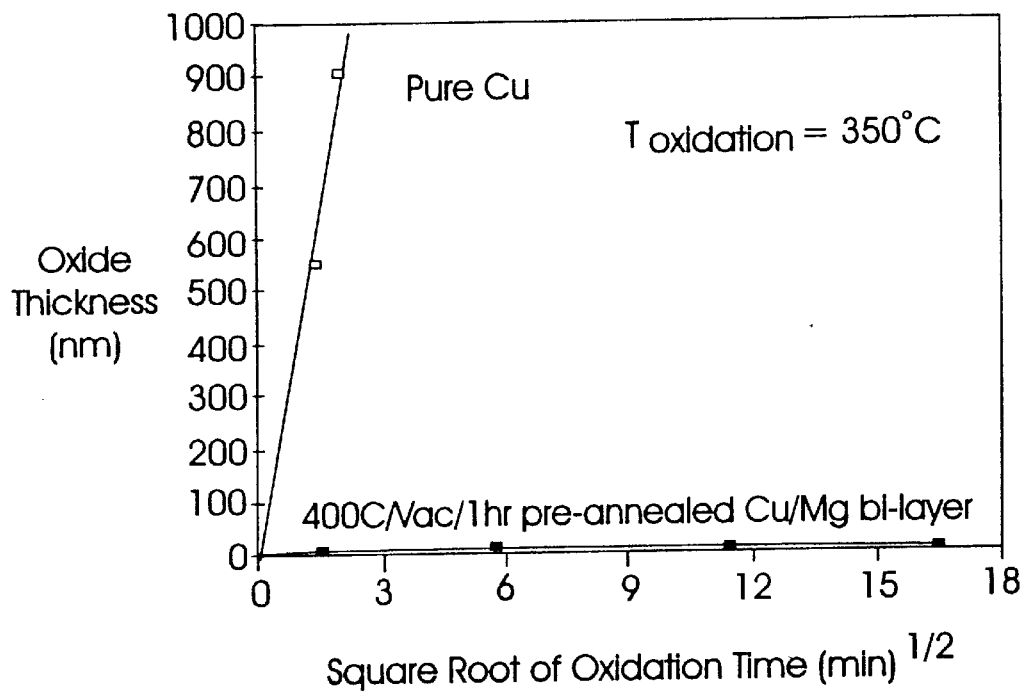
FIG. 5 is a plot of the thickness of surface oxide versus the square root of oxidation time at 350° C. in air, with results given for both pure copper and for annealed $Cu/Mg/SiO_2$ bilayer films.

FIG. 5 illustrates the excellent oxidation resistance of films made using this procedure. FIG. 5 shows the thickness of surface oxide on films exposed. to air at 350° C. vs. the square root of the exposure time. Results are shown both for pure copper and for Cu/Mg/SiO$_2$ passivated films. As can be seen in FIG. 5, the pure copper film oxidizes rapidly under these conditions. The Cu/Mg/SiO$_2$ films develop a few nm of oxide (MgO) and then become inert. Even films exposed to air at 350° C. for more than 4 hours show no additional oxidation. These data illustrate how effective this passivation can be.

EXAMPLE 2

As indicated above, passivation using Al requires a more careful control of the residual amount of Al that remains dissolved in the copper after the passivated surface oxide has been formed. The first attempts to use Al in this general procedure by Ding et al., *J. Appl. Phy. Lett.* 65, 1778 (1994) showed large passivation effects but films with resistivity of approximately 4.5 $\mu\Omega$·cm. These films were made with Cu(500 nm)/Al(15 nm)/SiO$_2$ and after deposition were subjected to a single state annealing process to transport the Al to the surface and to oxidize the surface Al. The annealing stage was a vacuum anneal ($5\times10^{-5}$ Torr) at 400° C. for 60 minutes.

Figure 6:
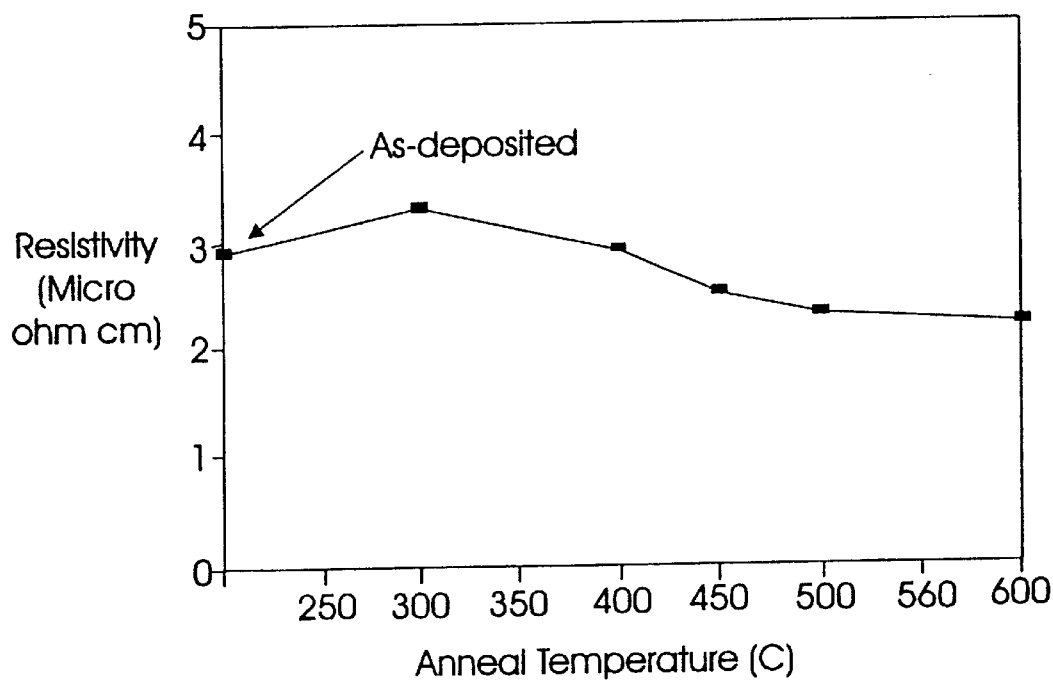
FIG. 6 is a plot of the resistivity of $Cu/Al/SiO_2$ films versus annealing temperature.
Figure 7:
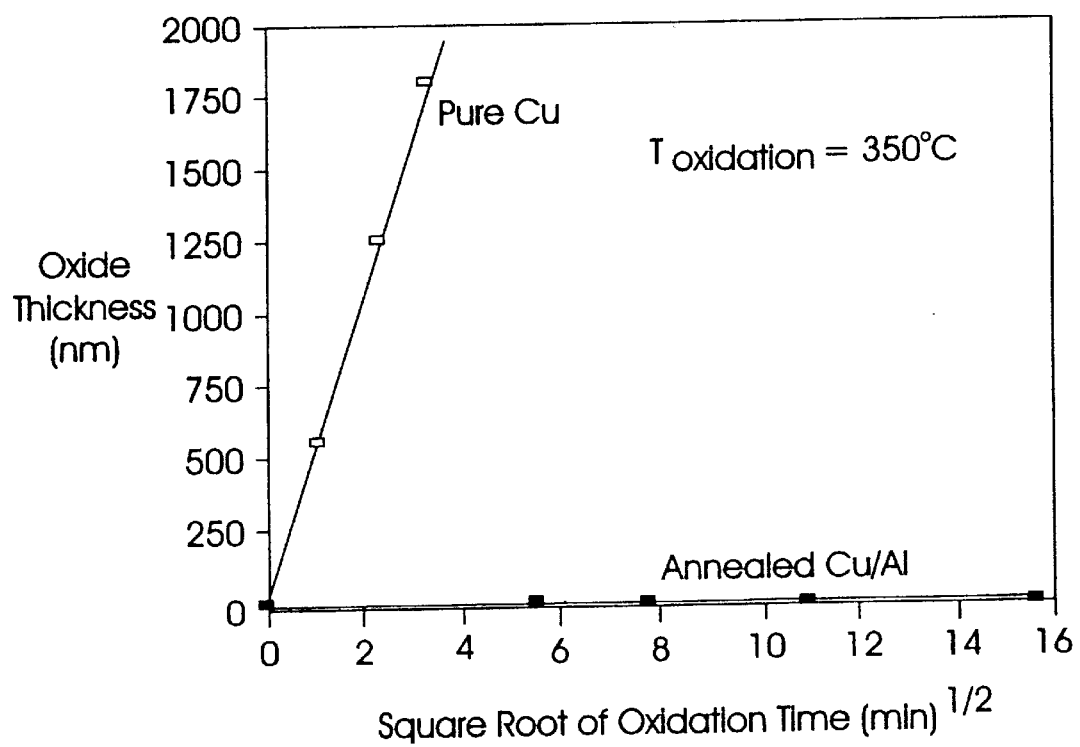
FIG. 7 is a plot of surface oxide thickness versus oxidation time at 350° C. in air for both a $Cu/Al/SiO_2$ film annealed at 450° C. and a pure copper film.

Recent work has shown that Cu/Al/SiO$_2$ films made and annealed in a cleaner environment with more carefully controlled amounts of Al are extremely well passivated with resistivity as low as 2.4 $\mu\Omega$ cm. In this case, Cu(500 nm)/Al(7 nm)/SiO$_2$ films were prepared by e-beam evaporation in a system with a base pressure of $2\times10^{-7}$ Torr and subsequently annealed in $6\times10^{-4}$ Torr oxygen at temperatures from 300° C. to 600° C. During this annealing stage, a surface of aluminum oxide forms which protects the copper from oxidation. FIG. 6 shows the resistivity of these Cu/Al/SiO$_2$ films versus annealing temperature. As seen in this figure, the as-deposited films have a resistivity of about 2.9 $\mu\Omega$ cm which first increases slightly (due to dissolving of Al into the copper) and then drops (due to removal of Al and defects in the copper) to about 2.4 $\mu\Omega$ cm. FIG. 7 shows the thickness of surface oxide of one of these films (annealed at 450° C.) versus oxidation time at 350° C. in air. Also shown for comparison is data for pure copper. After formation of a thin (5 nm) surface layer of aluminum oxide, these annealed bi-layer films become essentially inert.

More recent work has shown that by more careful control of contaminants during the deposition and annealing stages and as well as more careful control of the annealing stages leads to passivated films with even lower resistivity. In this case, films were made by sputter deposition in a system with a base vacuum of better than $10^{-9}$ Torr using ultra pure Ar sputter gas. Films were made consisting of Cu(500 nm)/Al/SiO$_2$ with Al thickness of 0, 5, 10, 20 nm. After deposition, these films were placed in an annealing chamber with a base pressure of below $10^{-9}$ Torr. Films were then subjected to two stage anneals, one stage in high vacuum at temperatures up to 400° C. and one stage in oxygen at $10^{-2}$ Torr. The resistivity of these films was monitored in situ with a four point probe during all annealing stages. From these studies, the following conclusion can be drawn:

1) Films made in such clean systems have lower resistivity than films made by the low vacuum sputter system described in example 1 above. Pure copper films made in this system have a resistivity of about 1.85 $\mu\Omega$·cm, compared to resistivity of about 2.0 $\mu\Omega$·cm for films made in the low vacuum sputter systems described in example 1 above.

2) Changes in film resistivity show that significant amounts of Al begin to dissolve into the copper at temperatures as low as 150–200° C.

3) By limiting the thickness of the Al film to 5 nm, there is essentially no increase in the film resistivity during the annealing stage. This confirms the expectation that it should be possible to develop a process in which, after the annealing and oxidation stages, there is an arbitrarily low residual concentration of Al in the bulk of the copper film.

The invention has been described in considerable detail with reference to the preferred embodiments and examples. The foregoing examples are illustrative of the present invention and are not to be construed as limitations thereof, and it would be apparent that numerous variations and modifications can be made without departure from the spirit and scope of the invention as described in the foregoing detailed specification. The invention is defined by the following claims, with equivalents of the claims to be included therein.

That which is claimed is:

1. A microelectronic device comprising:

a substrate having a face; and
   a copper conductor comprising:
      a metal layer on said face of said substrate;
      a copper layer on said metal layer, opposite said face; and
      a layer of an oxide of said metal on said copper layer opposite said metal layer.

2. The microelectronic device according to claim 1, wherein said substrate comprises silicon dioxide.

3. The microelectronic device according to claim 1, wherein said copper conductor has a resistivity of less than 3 micro-ohm·centimeter.

4. The microelectronic device according to claim 1, wherein said metal oxide layer has a thickness sufficient to passivate said copper layer to prevent oxidation thereof.

5. The microelectronic device according to claim 1, wherein said copper layer is thicker than said metal layer.

6. The microelectronic device according to claim 1, wherein said metal layer comprises a metal which diffuses through copper at less than 400° C.

7. A microelectronic device comprising:

a substrate having a face; and
   a copper conductor comprising:
      a metal layer comprising magnesium on said face of said substrate;
      a copper layer on said metal layer, opposite said face; and
      a layer of an oxide of said metal on said copper layer opposite said metal layer.

8. The microelectronic device according to claim 7, wherein said substrate comprises silicon dioxide.

9. The microelectronic device according to claim 7, wherein said copper layer comprises a conductive copper-magnesium alloy.

10. The microelectronic device according to claim 7, wherein said copper conductor has a resistivity of less than 3 micro-ohm·centimeter.

11. The microelectronic device according to claim 7, wherein said metal oxide layer has a thickness sufficient to passivate said copper layer to prevent oxidation thereof.

12. The microelectronic device according to claim 11, wherein said metal oxide layer on said copper layer is 3 to 7 nanometers thick.

13. The microelectronic device according to claim 7, wherein said copper layer is thicker than said metal layer.

14. A microelectronic device comprising:

a substrate having a face; and a copper conductor comprising:
- a metal layer comprising aluminum on said face of said substrate;
- a copper layer on said metal layer, opposite said face; and
- a layer of an oxide of said metal on said copper layer opposite said metal layer.

15. The microelectronic device according to claim 14, wherein said substrate comprises silicon dioxide.

16. The microelectronic device according to claim 14, wherein said copper layer comprises less than one weight percent of aluminum.

17. The microelectronic device according to claim 14, wherein said copper conductor has a resistivity of less than 3 micro-ohm·centimeter.

18. The microelectronic device according to claim 14, wherein said metal oxide layer has a thickness sufficient to passivate said copper layer to prevent oxidation thereof.

19. The microelectronic device according to claim 18, wherein said metal oxide layer on said copper layer is 3 to 7 nanometers thick.

20. The microelectronic device according to claim 14, wherein said copper layer is thicker than said metal layer.

* * * * *